United States Patent
Shindo (10) Patent No.: US 10,829,869 B2
(45) Date of Patent: Nov. 10, 2020

(54) SINGLE-CRYSTAL PRODUCTION EQUIPMENT AND SINGLE-CRYSTAL PRODUCTION METHOD

(71) Applicant: Crystal Systems Corporation, Hokuto (JP)

(72) Inventor: Isamu Shindo, Hokuto (JP)

(73) Assignee: Crystal Systems Corporation, Hokuto (JP)

( * ) Notice: Subject to any disclaimer, the term of this patent is extended or adjusted under 35 U.S.C. 154(b) by 87 days.

(21) Appl. No.: 15/736,467

(22) PCT Filed: May 31, 2017

(86) PCT No.: PCT/JP2017/020227
§ 371 (c)(1),
(2) Date: Dec. 14, 2017

(87) PCT Pub. No.: WO2018/003386
PCT Pub. Date: Jan. 4, 2018

(65) Prior Publication Data
US 2019/0085482 A1 Mar. 21, 2019

(30) Foreign Application Priority Data
Jun. 29, 2016 (JP) .................. 2016-128546

(51) Int. Cl.
*C30B 35/00* (2006.01)
*C30B 11/08* (2006.01)
(Continued)

(52) U.S. Cl.
CPC .......... *C30B 35/007* (2013.01); *C30B 11/001* (2013.01); *C30B 11/002* (2013.01);
(Continued)

(58) Field of Classification Search
CPC ....... C30B 11/00; C30B 29/06; C30B 11/002; C30B 11/04; C30B 13/08; C30B 15/02;
(Continued)

(56) References Cited

U.S. PATENT DOCUMENTS 4,379,021 A * 4/1983 Damen ................... C30B 11/00
117/73
5,108,720 A 4/1992 Bourbina et al.
(Continued)

FOREIGN PATENT DOCUMENTS

CN 101910473 A 12/2010
EP 0787837 A1 6/1997
(Continued)

OTHER PUBLICATIONS

Dym, "Practical Handbook of Injection Mold and Injection Molding", 1987, p. 265, Chemical Industry Press, Hong Guobao School, English-language Translation by Shen Jintang.
(Continued)

*Primary Examiner* — Matthew J Song
(74) *Attorney, Agent, or Firm* — The Webb Law Firm (57) ABSTRACT

Produced is a large single crystal with no crystal grain boundary, which is a high-quality single crystal that has a uniform composition in both the vertical and horizontal directions at an optimum dopant concentration and contains only a small number of negative crystals and exsolution lamellae. A single-crystal production equipment includes at least: a quartz crucible in which a seed crystal is placed on its bottom; a powder raw material supply apparatus which supplies a powder raw material into the quartz crucible; and an infrared ray irradiation apparatus which applies an infrared ray to the powder raw material supplied into the quartz crucible from the powder raw material supply apparatus.

26 Claims, 3 Drawing Sheets

(51) Int. Cl.
*C30B 29/06* (2006.01)
*C30B 17/00* (2006.01)
*C30B 11/00* (2006.01)
*C30B 13/14* (2006.01)
*C30B 13/08* (2006.01)
*C30B 15/02* (2006.01)

(52) U.S. Cl.
CPC ............ *C30B 11/003* (2013.01); *C30B 11/08* (2013.01); *C30B 13/08* (2013.01); *C30B 13/14* (2013.01); *C30B 15/02* (2013.01); *C30B 17/00* (2013.01); *C30B 29/06* (2013.01)

(58) Field of Classification Search
CPC ....... C30B 35/00; C30B 11/007; C30B 13/10; C30B 13/14; C30B 15/002
See application file for complete search history.

(56) References Cited

U.S. PATENT DOCUMENTS

| | | | |
|---|---|---|---|
| 5,116,456 A * | 5/1992 | Nestor | C30B 11/00 117/83 |
| 5,178,719 A * | 1/1993 | Pandelisev | C30B 11/00 117/74 |
| 5,211,802 A | 5/1993 | Kaneko et al. | |
| 5,367,981 A | 11/1994 | Maruyama | |
| 5,902,395 A | 5/1999 | Nagai et al. | |
| 5,916,364 A | 6/1999 | Izumi | |
| 5,919,306 A | 7/1999 | Takemura | |
| 5,961,715 A * | 10/1999 | Ikeda | C30B 15/14 117/13 |
| 6,325,849 B1 * | 12/2001 | Hideo | C30B 29/42 117/82 |
| 6,387,178 B1 | 5/2002 | Geho et al. | |
| 2007/0051296 A1 | 3/2007 | Kemmochi et al. | |
| 2007/0051297 A1 | 3/2007 | Kemmochi et al. | |
| 2007/0056504 A1 * | 3/2007 | Lim | C30B 15/04 117/13 |
| 2009/0047203 A1 * | 2/2009 | Mueller | C30B 11/14 423/348 |
| 2009/0249994 A1 * | 10/2009 | Liu | C30B 11/002 117/3 |
| 2010/0037817 A1 | 2/2010 | Shindo | |
| 2010/0307406 A1 * | 12/2010 | Shindo | C30B 13/24 117/206 |
| 2012/0228081 A1 * | 9/2012 | Tadokoro | B65G 11/146 193/30 |
| 2013/0220215 A1 * | 8/2013 | Eidelman | C30B 15/02 117/214 |
| 2014/0158858 A1 * | 6/2014 | Yamao | C01B 21/068 249/115 |
| 2015/0176150 A1 * | 6/2015 | Broyer | C30B 11/002 423/625 |
| 2016/0024685 A1 * | 1/2016 | Swaminathan | C30B 15/002 117/34 |
| 2016/0060787 A1 | 3/2016 | Park | |

FOREIGN PATENT DOCUMENTS

| | | |
|---|---|---|
| EP | 2128308 A1 | 2/2009 |
| JP | S5915056 U | 1/1984 |
| JP | S61197493 A | 9/1986 |
| JP | 5-286791 A | 11/1993 |
| JP | H6345583 A | 12/1994 |
| JP | H09249494 A | 9/1997 |
| JP | 2004189537 A | 7/2004 |
| JP | 200881398 A | 4/2008 |
| JP | 2014076915 A | 5/2014 |
| JP | 2014141360 A | 8/2014 |

OTHER PUBLICATIONS

Pu, "Universal Library for Primary and Middle School Students Information Technology", 2010, p. 63, Hefei Huangshan Book Company, English-language Translation.

Zhu, "Application and Modification of Polypropylene Plastic", 1982, pp. 338-339, Light Industry Press, English-language Translation.

* cited by examiner

SINGLE-CRYSTAL PRODUCTION EQUIPMENT AND SINGLE-CRYSTAL PRODUCTION METHOD

CROSS-REFERENCE TO RELATED APPLICATIONS

This application is the United States national phase of International Application No. PCT/JP2017/020227 filed May 31, 2017, and claims priority to Japanese Patent Application No. 2016-128546 filed Jun. 29, 2016, the disclosures of which are hereby incorporated in their entirety by reference.

TECHNICAL FIELD

The present invention relates to: a single-crystal production equipment which highly efficiently produces a large single crystal of larger than, for example, 800 to 1,000 mm in diameter while homogenizing its composition to be optimum; and a single-crystal production method of producing a large single crystal using the single-crystal production equipment.

BACKGROUND ART

In the so-called solar cell industry where solar energy is utilized to generate power used as electrical energy, a variety of materials have been examined and put into practice as materials that convert sunlight into electrical energy; however, silicon accounts for the greater part of the market.

Although the power generation cost using a solar cell have been largely reduced than before, it is still considered rather high as compared to the power generation cost of, for example, a thermal power plant using fossil energy, a hydraulic power plant or a nuclear power plant, and a further cost reduction is demanded.

In solar cells using semiconductor silicon, since the ratio of the price of a silicon single-crystal substrate with respect to the whole solar cell is high, methods of inexpensively producing a high-performance silicon single-crystal substrate have been investigated.

Meanwhile, studies have also been made on methods of highly efficiently extracting electrical energy from solar energy using a silicon single-crystal substrate and, recently, there are growing expectations for N-type silicon single-crystal substrates in which phosphorus is doped to raw material silicon.

Specifically, a system called "HIT type", in which amorphous silicon that can be used in a relatively short wavelength region and a phosphorus-doped N-type silicon single crystal that can be used in a relatively long wavelength region are used in combination, is highly expected to be able to achieve high conversion efficiency.

For utilization of a semiconductor silicon as a solar cell, the semiconductor silicon may be of boron-doped P-type or phosphorus-doped N-type; however, HIT-type solar cells, which are expected as high-efficiency solar cells as described above, require an N-type silicon single-crystal substrate. Further, also in a system where electrodes that used to be arranged on both sides of a substrate are arranged only on the back side and highly efficient utilization of sunlight is thereby made possible, an N-type silicon single-crystal substrate is required in the same manner as in HIT-type solar cells.

In the conventional semiconductor silicon-using solar cell industry, it has been considered desirable to utilize a single crystal since a single crystal which maintains the same orientational relationship in its entirety as a material can achieve the highest conversion efficiency.

However, a product called "polycrystal", which is an aggregate of small single crystals, has also been used in many cases since its production cost is relatively cheap while the production cost of a single crystal is rather high. In such a polycrystal, since a large strain is created at the boundaries of small single crystals (referred to as "grain boundaries") and the properties such as electrical conductivity are thus deteriorated, the use of a polycrystal as a solar cell has lower power generation efficiency than the use of a single crystal.

As methods of producing a silicon crystal used for a silicon solar cell substrate, for example, casting method, unidirectional solidification and pulling method are known. Since silicon is highly reactive, the material capable of retaining a melt thereof is limited to quartz. In the production of a single crystal by melting and then solidifying a silicon raw material in a crucible made of quartz (quartz crucible), since silicon and quartz are fused together and solidified, there is a problem that cracks are entirely generated in the cooling process.

Thus, a so-called "casting method" in which a melt is poured into a carbon mold and then solidified was developed. The carbon material reacts with a silicon melt to generate silicon carbide; however, since this is restricted to the vicinity of the mold surface, a silicon crystal is obtained inside the resulting solidified product.

Such a casting method is a production method derived from so-called casting production method and, in the early days, a polycrystal used to be produced by pouring a raw material melt prepared in a large crucible into a small casting crucible and then solidifying the melt.

However, in this casting method, since an infinite number of single-crystal particles grow from all over the small crucible toward the center, the properties of the resulting poly-crystal, such as electrical conductivity, are deteriorated in the vicinity of the center of the small crucible.

Accordingly, the efficiency was improved by contriving the temperature distribution such that solidification proceeds from the bottom of individual small crucibles in the upward direction.

Such a method in which a raw material melt is poured into individual small crucibles and then solidified is a casting method; however, a method in which, when solidifying a casted melt, a temperature gradient is formed in a crucible and solidification is thereby allowed to slowly proceed from a lower part to an upper part, is a method called "unidirectional solidification" in the discipline of crystal growth.

Thereafter, a method in which the surface of a large quartz crucible is coated with a release agent to prevent the quartz crucible and silicon from fusing together and to thereby inhibit cracking of the resulting solidified product was put into practice. The mainstream thus shifted from the previous method of pouring a melt into a crucible to a method of producing a large crystal by direct solidification of a melt in a melting furnace. This method is unmistakably a "unidirectional solidification method".

Particularly in Japan, such a "unidirectional solidification method" is habitually called "casting method" as before; however, this is a mistake.

In the unidirectional solidification method, since solidification of a melt does not start from one spot but from the entire bottom surface of a large crucible, a large number of single crystals start to grow separately. Consequently, a single crystal is not formed as a whole, and a product called "polycrystal" is produced.

Accordingly, as a method where the entirety of a melt is crystallized as a single crystal, a production method in which the bottom surface is inclined to lower the center part, a fixture storing a seed crystal is attached to the deepest part thereof, only this part is cooled such that the seed crystal is not completely melted, and then cooling is carried out once the raw material above the seed crystal is completely melted so as to proceed with crystallization only from the seed crystal, whereby a large single crystal can be produced, was developed. This production method is called "Bridgman method" from the developer's name.

When silicon is used, however, it is considered impossible to apply the Bridgman method since a release agent is used for inhibiting the fusion of the crucible and silicon and silicon microcrystals start to grow from the parts of this release agent, as a result of which a single crystal is not formed as a whole. As silicon crystals for solar cells, at present, polycrystal products obtained by unidirectional solidification method and single-crystal products obtained by pulling method are mainly used.

When installing a solar cell, since it is necessary to efficiently paste the solar cell within a limited area and to extract generated electricity with high efficiency, the silicon crystal substrate preferably has a tetragonal shape. Accordingly, a system where a silicon crystal for a solar cell is produced in the form of a quadrangular column and a required size is cut out therefrom and then further cut and processed into a thin plate form has been employed (for example, see Japanese patent document JP 2014-76915 A).

Also in the production of a silicon crystal by a unidirectional solidification method, a raw material is melted in a large tetragonal crucible and allowed to crystallize as is from a lower part in the upward direction. As described above, in this method, the resulting solidified product is an aggregate of a large number of single crystals as a whole, and the properties as a solar cell are deteriorated at the boundaries of the single crystals; therefore, as a silicon substrate for a solar cell, a product which has no such boundaries and is entirely composed of a single crystal is desired.

As methods of producing a single crystal, for example, pulling method, high-frequency floating zone method and ribbon pulling method are known, and a pulling method is employed in many cases. In a pulling method, a silicon raw material is melted in a quartz crucible, a thin silicon single crystal (seed crystal) is immersed therein, and a single crystal is allowed to grow continuously while the seed crystal is gradually fattened and pulled up, whereby a large single crystal is obtained.

For utilization of a silicon crystal as a solar cell, boron or phosphorus is doped thereto to generate electricity; however, an excessively low dopant concentration in the silicon crystal leads to a reduction in the conversion efficiency, and an excessively high dopant concentration deteriorates the conversion efficiency due to recombination.

Thus, there is an optimum concentration for both boron and phosphorus, and it is needless to say that a product that is uniform and has such an optimum concentration composition throughout the crystal is desired. The above-described pulling method is considered capable of producing a high-quality single crystal; however, it belongs to so-called unidirectional solidification method where a melt is entirely solidified from an upper part in the downward direction. Therefore, in the resulting product, the concentration of a dopant such as boron or phosphorus is not constant due to segregation phenomenon.

In other words, a melt and a solidified crystal do not have the same dopant concentration, and solidification proceeds at a ratio defined by the substance. This ratio is referred to as "distribution coefficient", and it is approximately 0.8 for boron and approximately 0.35 for phosphorus.

Accordingly, the dopant concentration in the crystal is low immediately after the start of solidification and, since a difference remains in the melt, the dopant concentration in the melt gradually increases as the crystal grows and, at the same time, the dopant concentration in the crystal being generated also increases in accordance with its ratio with respect to the concentration in the melt.

Therefore, in the case of a crystal to which phosphorus having a low distribution coefficient of approximately 0.35 is doped, there is an essential problem that the phosphorus concentration largely varies in the crystal and the part having an optimum composition is thus extremely small. That is, when a product is manufactured using only the optimum-composition part, although the product has a high conversion efficiency as a solar cell, the production cost is extremely high. On the other hand, when the cost is reduced by widening the composition range and using a crystal having a lower concentration than the optimum composition and a crystal having a higher concentration than the optimum composition, there is a dilemma that the conversion efficiency is deteriorated.

In the case of silicon for solar cells, since a product having a diagonal length of 220 mm is recently regarded as a standard-size product, in order to realize a reduction in the production cost of a pulling method, for example, it is considered to reduce the unit cost by producing a large single crystal having a diameter of greater than 450 mm, which is equivalent to producing four solar cells.

Still, when it is actually tried to produce such a large single crystal having a diameter of greater than 450 mm by a pulling method, an extra-large production apparatus is necessary, and this makes the production cost exceedingly high.

In the present silicon crystal production industry, a unidirectional solidification method is the production method capable of inexpensively producing a silicon crystal substrate for a solar cell; however, in a conventional unidirectional solidification method, since the whole raw material is initially melted in a crucible and then allowed to slowly solidify from the lower side (bottom side) toward the upper side, the tendency of the dopant concentration to be low immediately after the start of solidification and gradually increase as the growth proceeds is the same as in the above-described case of a pulling method.

In a method where the whole raw material is initially melted and then solidified, it is theoretically impossible to keep the concentration of phosphorus, which is a dopant, constant at an optimum composition.

In order to allow the composition of the entire solidified product to be uniform and optimum, it is necessary to employ a production method to which a so-called "traveling solvent method", which continuously performs melting of a raw material and solidification from the resulting melt, is applied. In this case, by controlling the amount at which the raw material having an optimum-concentration composition is supplied to be the same as the amount of the raw material being solidified from the melt, the resulting crystal is allowed to have a uniform and optimum composition. In this process, since the distribution coefficient is approximately 0.35 when the dopant is phosphorus, the dopant concentration in the melt phase is about three times higher than that of the optimum-concentration composition.

Further, in an existing unidirectional solidification method, since a large number of crystal particles start to grow all at once from the entire lower surface of a crucible, the resulting product is an aggregate of numerous small single crystals, and a countless number of grain boundaries of the small single crystals thus exist therein.

From the standpoint of the properties of a solar cell, the presence of grain boundaries is considered disadvantageous and, for the purpose of reducing the number of grain boundaries as much as possible, for example, a trial where a large seed crystal is placed on the bottom of a crucible and this seed crystal is allowed to grow as a single crystal has been reported.

However, such a method is not realistic since a thin seed crystal is highly likely to be melted, while the cost of a thick seed crystal is excessively high.

Further, reports have also been made on a method to which a so-called "local cooling solidification method", where a cold air is blown to the center of the bottom surface of a crucible so as to solidify only a raw material melt on the center of the bottom surface of the crucible and the number of grain boundaries is minimized by allowing crystallization to proceed therefrom to the entire melt, is applied. However, in this local cooling solidification method, since solidification proceeds radially from one spot and the resulting composition thus largely varies not only in the vertical direction but also in the horizontal direction, the performance of the product is degraded.

In addition, the pulling method involves a large problem attributed to the use of a quartz crucible, which is the formation of performance degradation-causing negative crystals and the below-described exsolution lamellae. Generally, in the production of a silicon crystal, a raw material produced by a method called "Siemens process" is used. In this process, a high-purity silane gas is hydrogen-reduced at a high temperature to form silicon, and an inverted U-shaped silicon rod having a diameter of around 13 cm and a height of around 200 cm with a round cross-section is produced in a large reaction vessel.

This raw material is a polycrystalline material composed of an aggregate of small crystal particles and commonly referred to as "polysilicon". As a product characteristic, it contains fine needle crystals. In the production of a single crystal, such a raw material is first completely melted in a quartz crucible and subsequently solidified to produce a single crystal; however, it is difficult to completely melt the needle crystals.

That is, in order to completely melt a raw material, although the raw material can be completely melted by raising the temperature for a prolonged period, quartz (silicon dioxide) used as a crucible material and molten silicon react with each other when the temperature is raised for a prolonged period in this manner, and a large amount of silicon monoxide is generated as a result.

This silicon monoxide is a volatile substance and thus mostly evaporates from the melt surface; however, a considerable amount thereof is incorporated into the resulting silicon crystal and forms a solid solution. The amount of such silicon monoxide increases as the temperature is raised and the time is extended; therefore, to raise the temperature and spend a sufficient time for completely melting the raw material creates a negative effect of increasing the amount of the incorporated silicon monoxide.

Thus, actually, crystal production is initiated in a state where a certain amount of needle crystals remains suspended in the melt. In this sense, quartz does not satisfy the properties with which a crucible material employed in a pulling method should be equipped; however, in reality, quartz is used since no other usable material can be found.

When a fine needle crystal remaining unmelted adheres to the surface of the growing silicon single crystal, the growth is inhibited at the site of the adhesion, and the growth is thus retarded than the surroundings, as a result of which a space protected by the surface tension of the melt is formed.

Once such a space grows to a certain size, it starts to close due to insufficient surface tension, and the crystal growth eventually continues as if nothing had happened; however, the space remains. This space is referred to as "negative crystal".

In the silicon industry, this negative crystal is commonly called "COP" (Crystal-Originated Particle); however, it should be formally called "negative crystal".

The negative crystal has a sub-micron size or so and, in the production of an LSI memory or the like, defective products are obtained since electrodes are finer than the negative crystal and thus cannot be connected; therefore, the formation of a negative crystal is one of undesirable defects.

Even a larger problem is that the silicon monoxide component contained in the silicon crystal as a solid solution causes a phenomenon called "ex-solution" starting at a temperature of around 1,000° C., and laminar deposition layers called "exsolution lamellae" are consequently formed in the resulting silicon single crystal.

When such exsolution lamellae are formed in the single crystal, the crystal surrounding the exsolution lamellae is disarranged, and microcracks are formed and numerous dislocations occur as a result, markedly deteriorating the properties of the silicon single crystal.

Thus, a measure that can minimize the incorporation of silicon dioxide, which is a crucible material, and silicon monoxide, which is a reaction product of the crucible material and molten silicon, into the product is demanded.

Although unidirectional solidification method has many drawbacks as described above, it is a method capable of producing a large tetragonal crystal whose length of one side can reach 100 cm, and this method is advantageous in that it has the lowest production cost as a method of producing a silicon crystal substrate.

Therefore, development of a method by which a high-quality large single crystal that contains only a small amount of silicon dioxide and silicon monoxide components and has a uniform dopant concentration can be produced while taking advantage of the characteristics of the Bridgman method, which is a unidirectional solidification method improved as a single-crystal production method, would render an immeasurable contribution to the fields where silicon single crystals are utilized, such as the solar cell industry.

As a substrate for a high-quality solar cell, a product that is a silicon single crystal and uniform at an optimum dopant concentration is demanded; however, a single crystal cannot be obtained by an existing unidirectional solidification method, and the product thereof does not have uniform dopant concentration. Although a pulling method yields a single-crystal product, its dopant concentration is not uniform. Moreover, both of these methods include defects such as negative crystals and exsolution lamellae, causing performance degradation.

In view of the above-described circumstances, an object of the present invention is to provide a single-crystal production equipment and a single-crystal production method, by which a single crystal that has uniform dopant concentration in both the vertical and horizontal directions and contains only a small number of negative crystals and exsolution lamellae can be produced while making the most of the advantages of the Bridgman method that is capable of producing a large single crystal.

For the production of a single crystal that is uniform at an optimum dopant concentration, a single-crystal production equipment which has functions of solidifying a single crystal from a melt having a composition that can yield a crystal at the optimum dopant concentration and, at the same time, continuously supplying a raw material having the optimum dopant concentration in the same amount as the amount of the raw material being solidified, is required.

Further, at the end of the crystal production operations, since the dopant concentration is not constant in those parts where the thus formed melt phase is solidified by cooling and the dopant concentration increases toward the end point, the product has a poor quality. Therefore, in order to improve the yield of a good-quality product, the thickness of the melt phase to be formed is desirably thin.

SUMMARY OF THE INVENTION

As means for solving the above-described problems, the present inventor invented the following novel single-crystal production equipment and single-crystal production method.

That is, the existing unidirectional solidification method, which is employed as a method capable of inexpensively producing a solar cell substrate, has a drawback in that it cannot produce a high-performance single crystal and can only produce a polycrystal. Thus, the elemental technologies of the Bridgman method, which is known as a method that improves the drawback and is capable of producing a single crystal, were incorporated.

In the Bridgman method, however, there is a drawback that the dopant concentration gradually increases as the growth of a crystal and the dopant concentration thus cannot be made uniform throughout the product. In order to overcome this drawback, a configuration to which a traveling solvent method can be applied was adopted.

Further, for the application of the traveling solvent method, a heater such as a carbon heater is usually used and the heater is arranged above a melt phase; however, since it is extremely difficult to allow the heat emitted from the heater to efficiently move downward, the heat transfer was made easy by irradiating an infrared ray instead. At the same time, in the formation of a solution phase by irradiation with an infrared ray, a thin melt phase was successfully formed by rather taking advantage of the inability to increase the thickness of the solution phase in association with absorption of the infrared ray.

When a powder raw material (crystal base material powder+dopant doped powder) is supplied to such a thin melt phase, the powder raw material (crystal base material powder+dopant doped powder) may precipitate before being melted and adhere to a crystal phase thereunder. Such adhesion causes deterioration of the product performance in direct association with the above-described formation of negative crystals, and adhesion of the powder raw material in large aggregates initiates the growth of not only negative crystals but also new microcrystals, so that a polycrystal may be produced.

Nevertheless, it was discovered that, in cases where the crystal base material powder is, for example, a silicon powder, since the powder floats on the melt and never precipitates due to its smaller specific gravity as a solid than that of the melt, polycrystal formation caused by the generation of negative crystals and new microcrystals does not occur when the powder raw material is supplied at a size of 0.1 to 0.5 mm or so.

It was also discovered that, although the supplied powder raw material (crystal base material powder+dopant doped powder) can be melted by irradiating it with an infrared ray from the above and a melt phase can thereby be formed, since the amount of the infrared ray reaching the lower side of the thus formed melt phase rapidly decreases due to absorption of the infrared ray by the melt and less heat is thus applied, the thickness of the melt phase is not easily increased to a certain thickness or greater. This was extremely convenient for keeping the melt phase to be formed thin.

Furthermore, it was discovered that, although the powder raw material (crystal base material powder+dopant doped powder) contains a large number of fine needle crystals and these needle crystals are suspended in the melt, the needle crystals can also be easily and completely melted by irradiation with an infrared ray.

The powder raw material (crystal base material powder+dopant doped powder) can be melted solely by irradiation with an infrared ray; however, by arranging a carbon-made auxiliary heating apparatus on the outer surface of the bottom and vertical wall section of a quartz crucible and heating the powder raw material to about 1,300° C. in advance, it was made possible to reduce the irradiation dose of the infrared ray and to improve the controllability.

The single-crystal production equipment of the present invention comprises, at least:

a quartz crucible in which a seed crystal is placed on its bottom;

a powder raw material supply apparatus which supplies a powder raw material into the quartz crucible; and an infrared ray irradiation apparatus which irradiates an infrared ray to the powder raw material supplied into the quartz crucible from the powder raw material supply apparatus, said single-crystal production equipment being configured to produce a single crystal in the quartz crucible by applying the infrared ray into the quartz crucible from the infrared ray irradiation apparatus and thereby melting and solidifying the powder raw material, wherein the single-crystal production equipment is configured such that:

the powder raw material is irradiated with the infrared ray by the infrared ray irradiation apparatus while being supplied into the quartz crucible from the powder raw material supply apparatus; and said powder raw material supply apparatus continuously supplies the powder raw material into the quartz crucible in accordance with an amount of melted powder raw material being solidified.

By this configuration, the powder raw material (crystal base material powder+dopant doped powder) is continuously supplied into the quartz crucible in the same amount as that of crystallized powder raw material in accordance with the growth of a single crystal, so that a single crystal having a uniform composition in both the vertical and horizontal directions at an optimum dopant concentration can be produced.

The single-crystal production equipment of the present invention is characterized in that an auxiliary heating apparatus is arranged on an outer surface of the bottom and of a vertical wall section of the quartz crucible.

With an auxiliary heating apparatus being arranged on the outer surface of the bottom and vertical wall section of the quartz crucible in this manner, the dose of the infrared ray to be irradiated can be reduced and the controllability can be improved by heating the powder raw material in advance and then melting the powder raw material by irradiation with the infrared ray. Therefore, the powder raw material can be melted efficiently.

The single-crystal production equipment of the present invention is also characterized in that the powder raw material supply apparatus comprises:

a hopper which stores the powder raw material;

a supply adjustment unit which supplies a prescribed amount of the powder raw material stored in the hopper to a prescribed position in the quartz crucible; and a supply pipe which is arranged on a lower end of the supply adjustment unit and through which the powder raw material is supplied into the quartz crucible.

By this configuration, the powder raw material can be surely supplied into the quartz crucible.

Further, the single-crystal production equipment of the present invention is characterized in that the supply adjustment unit comprises a supply rate adjustment apparatus which adjusts a rate at which the powder raw material is supplied into the quartz crucible.

With the supply rate adjustment apparatus in this manner, for example, by increasing the supply rate in the vicinity of the center of the quartz crucible while decreasing the supply rate toward the vertical wall section of the quartz crucible, the amount of the powder raw material to be supplied can be reduced in the vicinity of the center of the quartz crucible and increased toward the vertical wall section of the quartz crucible, as a result of which the powder raw material can be uniformly supplied into the quartz crucible.

Still further, the single-crystal production equipment of the present invention is characterized in that the supply adjustment unit comprises a supply position adjustment apparatus which adjusts a position at which the powder raw material is supplied in the quartz crucible.

As long as the supply position can be adjusted in this manner, the powder raw material can be uniformly supplied into the quartz crucible.

Yet still further, the single-crystal production equipment of the present invention is characterized in that the hopper is configured such that a powder raw material container, which stores the powder raw material, is detachably attached thereto.

When the powder raw material container can be attached or detached as desired in this manner, the powder raw material can be freshly supplied even in the midst of operating the single-crystal production equipment to produce a single crystal, and this enables to continuously supply a required amount of the powder raw material into the quartz crucible at all times without having to hold an extremely large powder raw material container, so that an increase in the size of the equipment can be avoided.

Yet still further, the single-crystal production equipment of the present invention is characterized in that the hopper is constituted by:

a hopper for crystal base material powder, which stores a crystal base material powder; and a hopper for dopant doped powder, which stores a dopant doped powder.

By storing the crystal base material powder and the dopant doped powder in separate hoppers in this manner, a desired composition ratio can be easily attained in the supply adjustment unit.

For example, when growing a phosphorus-doped N-type silicon single crystal, the powder raw material (silicon powder+dopant doped powder) to be supplied first is adjusted to have a phosphorus concentration that is three times higher than that of an optimum-concentration composition, and this powder raw material is supplied in the same amount as that of a melt phase formed in a steady state.

Then, the powder raw material (silicon powder+dopant doped powder) having the optimum-concentration composition is supplied in an amount controlled to be the same as that of the material being solidified, whereby the resulting single crystal is allowed to have a composition that roughly conforms to the optimum-concentration composition from the beginning, so that the good-quality product yield as a whole can be improved.

It is noted here that, for the production of a boron-containing P-type silicon single crystal, the powder raw material (silicon powder+dopant doped powder) to be supplied first is adjusted to have a dopant doped concentration that is 1.25 times higher than that of an optimum-concentration composition and, in the same manner, this powder raw material is introduced in the same amount as that of a melt formed in a steady state, after which the powder raw material (silicon powder+dopant doped powder) having the optimum-concentration composition is supplied in an amount controlled to be the same as that of the material being solidified.

Yet still further, the single-crystal production equipment of the present invention is characterized in that the hopper is a hopper for mixed powder, which stores a mixed powder obtained by mixing a crystal base material powder and a dopant doped powder.

By using, in this manner, a hopper for mixed powder which stores a mixed powder obtained by mixing a crystal base material powder and a dopant doped powder, the size of the equipment can be reduced as compared to a case where different hoppers are separately arranged, and a certain composition ratio can be surely maintained.

In this case, however, the dopant concentration of a melt phase initially formed in the quartz crucible is required to be higher than that of the powder raw material at a ratio defined by distribution coefficient. Therefore, by supplying in advance the powder raw material into the quartz crucible in an amount that corresponds to the required amount of a solvent phase, melting this powder raw material first to form a solvent phase and then starting to supply other powder raw material, a single crystal having a uniform composition in this entirety can be produced.

Yet still further, the single-crystal production equipment of the present invention is characterized in that the hopper comprises:

a hopper for crystal base material powder, which stores a crystal base material powder; and a hopper for mixed powder, which stores a mixed powder obtained by mixing a crystal base material powder and a dopant doped powder.

By preparing and storing a crystal base material powder and a mixed powder separately in this manner, a single crystal having a uniform composition in both the vertical and horizontal directions at an optimum dopant concentration can be produced.

Yet still further, the single-crystal production equipment of the present invention is characterized in that the crystal base material powder is a silicon powder.

When the crystal base material powder is a silicon powder in this manner, for example, a silicon single crystal used in a semiconductor-related product can be produced.

Yet still further, the single-crystal production equipment of the present invention is characterized in that a recess is formed in a vicinity of a center on the bottom of the quartz crucible, and the seed crystal is placed in the recess.

By forming a recess in this manner, for example, the seed crystal can be placed in an upright position and, by reducing the gap between the recess and the seed crystal as much as possible, generation of a new coarse crystal from a site other than the seed crystal can be inhibited.

Yet still further, the single-crystal production equipment of the present invention is characterized in that a slope inclined toward the center is formed on the bottom of the quartz crucible, and the slope is inclined at an angle in a range of 3 to 60 degrees.

By forming a slope in this manner, the size of the resulting single crystal can be gradually increased from the bottom side toward the upper side in the quartz crucible. When this slope (inclination angle) is excessively small, the likelihood of other microcrystals being formed in the middle is increased. Meanwhile, when this slope (inclination angle) is excessively large, since the solidified product obtained before the solidification reaches the vertical wall section has a non-standard size, the product yield as a whole is deteriorated.

Yet still further, the single-crystal production equipment of the present invention is characterized in that the quartz crucible is housed inside a carbon crucible.

By housing the quartz crucible inside the carbon crucible in this manner, the mechanical strength can be maintained by the carbon crucible on the outside, and this enables to stably use the quartz crucible on the inside. That is, when the quartz crucible is used alone, it is difficult to make the quartz crucible self-supporting since the quartz material softens around the melting point of the crystal base material powder; however, this can be improved by housing the quartz crucible inside the carbon crucible.

Yet still further, the single-crystal production equipment of the present invention is characterized in that the infrared ray irradiation apparatus comprises:

an elliptical reflector whose inner surface is used as a reflection surface; and an infrared lamp which is arranged at a first focus position on the bottom side of the elliptical reflector.

By using such an infrared ray irradiation apparatus, an infrared ray can be efficiently irradiated.

Yet still further, the single-crystal production equipment of the present invention is characterized in that the infrared lamp is a halogen lamp or a xenon lamp.

Since a halogen lamp or a xenon lamp can be obtained inexpensively, the production cost of the single-crystal production equipment can be reduced.

Yet still further, the single-crystal production equipment of the present invention is characterized in that the infrared ray irradiation apparatus is a semiconductor laser module which applies a laser beam of the infrared ray.

By using a semiconductor laser module in this manner, the size of the infrared ray irradiation apparatus can be reduced, which contributes to downsizing of the single-crystal production equipment.

Yet still further, the single-crystal production equipment of the present invention is characterized in that a plurality of said infrared ray irradiation apparatus is arranged.

By arranging a plurality of infrared ray irradiation apparatuses in this manner, the powder raw material can be more stably and surely melted as compared to a case where only one infrared ray irradiation apparatus is arranged. In addition, with the infrared ray irradiation apparatus being arranged in a plural number in this manner, the melting surface of the quartz crucible can be heated uniformly.

By uniformly heating the melting surface of the quartz crucible, a single crystal having a uniform composition in both the vertical and horizontal directions can be produced.

Yet still further, the single-crystal production equipment of the present invention is characterized by further comprising an infrared ray local irradiation apparatus separately from the infrared ray irradiation apparatus, which infrared ray local irradiation apparatus applies an infrared ray to only to a periphery of a melt formed in the quartz crucible and thereby increases a temperature in a vicinity of the periphery of the melt formed in the quartz crucible to be higher than a temperature of an entirety of said melt in the said quartz crucible.

This infrared ray local irradiation apparatus is configured such that it can constantly heat only the vicinity of the periphery of the melt, in accordance with the change size of the melt if any.

By arranging such an infrared ray local irradiation apparatus in this manner, crystallization from a release agent-coated part of the inner wall of the quartz crucible can be retarded and, at the same time, even if a new microcrystal is generated from this part, the growth thereof toward the center can be inhibited, the growth of a large single crystal in the center can be prevented from being adversely affected by such a microcrystal.

Moreover, the melt formed in this manner reacts with the crucible material to generate silicon monoxide; however, since the area of the powder raw material in contact with the melt is reduced by double digits as compared to an ordinary unidirectional solidification method where the raw material is entirely melted, the amount of silicon monoxide to be generated can also be reduced accordingly.

The above-described exsolution lamellae are not formed at such a small amount of silicon monoxide; therefore, deterioration of the properties of the resulting single crystal can be inhibited.

The temperature in the vicinity of the periphery of the melt formed in the quartz crucible, which is increased by the infrared ray local irradiation apparatus, is preferably at least 3° C. higher than the temperature of the whole quartz crucible.

Yet still further, the single-crystal production equipment of the present invention is characterized in that an infrared ray transmission window, which transmits the infrared ray applied from the infrared ray irradiation apparatus and/or the infrared ray local irradiation apparatus, is arranged between the infrared ray irradiation apparatus and the quartz crucible.

In the present equipment, it is indispensable that a thin melt phase be formed on the upper side of a growing single crystal; the powder raw material (crystal base material powder+dopant doped powder) be supplied thereto and melted; and crystallization be allowed to continue on the lower side the melt phase. This configuration enables to form a thin melt phase with high efficiency by irradiating an infrared ray from outside the closed chamber.

Theoretically, it is also possible to arrange such an infrared ray irradiation apparatus inside the closed chamber, and this has an advantage of not requiring the above-described infrared ray transmission window; however, in this case, since it becomes necessary to increase the size of the closed chamber and to inhibit adhesion of components evaporated from the melt to the elliptical reflector, there is a disadvantage of making stable use difficult.

Yet still further, the single-crystal production equipment of the present invention is characterized in that an evaporant adhesion-inhibiting apparatus is arranged on a crucible-side outer periphery of the infrared ray transmission window.

By arranging an evaporant adhesion-inhibiting apparatus on the crucible-side outer periphery of the infrared ray transmission window in this manner, adhesion of an evaporant of the powder raw material melt to the infrared ray transmission window and consequent reduction in the amount of the infrared ray that should reach the quartz crucible can be inhibited.

Yet still further, the single-crystal production equipment of the present invention is characterized in that the quartz crucible is configured to be rotatable.

By configuring the quartz crucible to be rotatable in this manner, the powder raw material can be uniformly irradiated with the infrared ray emitted from the infrared ray irradiation apparatus, so that the powder raw material can be evenly heated. As a result, a single crystal having a uniform composition in both the vertical and horizontal directions can be produced.

Yet still further, the single-crystal production equipment of the present invention is characterized in that the quartz crucible is configured to be movable in a vertical direction at a prescribed speed.

By configuring the quartz crucible to be movable in the vertical direction in this manner, the positions of the infrared ray irradiation apparatus and the infrared ray transmission window can be fixed at all times, which is convenient.

Yet still further, the single-crystal production equipment of the present invention is characterized in that the quartz crucible and the auxiliary heating apparatus are housed in a vacuum-evacuable closed chamber.

By housing the quartz crucible and the auxiliary heating apparatus in a closed chamber in this manner, the crystal base material powder can be prevented from reacting with the air to be oxidized, so that a high-purity and high-quality single crystal containing no impurity can be produced.

Yet still further, the single-crystal production equipment of the present invention is characterized in that the closed chamber is a water-cooling structure.

With the closed chamber being a water-cooling structure in this manner, deterioration of sealed parts and the like caused by an increase in the temperature of the closed chamber is inhibited and high-precision atmosphere control can thus be performed efficiently, so that a single crystal can be produced with good yield.

Yet still further, the single-crystal production equipment of the present invention is characterized in that the closed chamber is configured to be movable in a vertical direction together with the infrared ray irradiation apparatus arranged outside the closed chamber.

With the closed chamber being movable together with the infrared ray irradiation apparatus in this manner, the positions of the infrared ray irradiation apparatus and the infrared ray transmission window can be fixed at all times and, since it is not necessary to change the irradiation angle of the infrared ray irradiation apparatus in accordance with the growth of a single crystal, a single crystal can be produced with good yield.

Yet still further, the single-crystal production equipment of the present invention is characterized in that the above-described dopant is phosphorus or boron.

When the dopant is phosphorus or boron in this manner, an N-type semiconductor silicon or a P-type semiconductor silicon can be produced. In cases where a substance other than phosphorus or boron, such as antimony, arsenic or gallium, is used as the dopant, a single crystal having a uniform composition can also be produced in the same manner by forming a melt having a concentration that corresponds to the distribution coefficient of each substance.

The single-crystal production method of the present invention is a method of producing a single crystal, which is characterized by comprising:

placing a seed crystal on a bottom of a quartz crucible and supplying a powder raw material into the quartz crucible; and subsequently melting and solidifying the powder raw material by applying an infrared ray into the quartz crucible, wherein the powder raw material is continuously supplied into the quartz crucible in accordance with an amount of the raw material being solidified in the quartz crucible.

By this single-crystal production method, a large high-quality single crystal having a uniform and optimum composition as the orientation of a seed crystal can be easily produced. According to this method, as the growth of a single crystal proceeds, by continuously supplying a powder raw material (crystal base material powder+dopant doped powder) in the same amount as the amount of the crystallized material and maintaining the interface between the crystal and a melt to be planar at all times, a single crystal having a uniform composition in both the vertical and horizontal directions can be produced.

Specifically, it is desired to maintain the distance between the position of an infrared ray irradiation apparatus (a halogen lamp, a xenon lamp or a semiconductor laser module) and the surface of the melt in the quartz crucible constant.

Accordingly, as crystallization proceeds, the surface of the melt is elevated since the powder raw material (crystal base material powder+dopant doped powder) is replenished and, in order to maintain this constant, a method of moving the quartz crucible downward and a method of moving the infrared ray irradiation apparatus upward can both be employed.

However, if the position of the infrared ray irradiation apparatus is elevated while an infrared ray transmission window, which is set in a closed chamber, is maintained at the same position, for example, when an infrared ray is irradiated downward from diagonally above, the position of the infrared ray transmission window at which the infrared passes through is shifted as the infrared ray irradiation apparatus is moved, and this is inconvenient since a large size is required. In such a case, the positions of the infrared ray irradiation apparatus and the infrared ray transmission window can be fixed at all times by moving the closed chamber upward, which is convenient.

Therefore, in the single-crystal production method of the present invention, a high-quality single crystal having a uniform composition in both the vertical and horizontal directions can be produced with good yield.

The single-crystal production method of the present invention is also characterized in that a recess is formed in a vicinity of a center on the bottom of the quartz crucible, and the seed crystal is placed in the recess.

By forming a recess in this manner, the seed crystal can be placed in an upright position and, by reducing the gap between the recess and the seed crystal as much as possible, generation of a new coarse microcrystal from a site other than the seed crystal can be inhibited.

The upper part of this seed crystal is melted along with the powder raw material (crystal base material powder+dopant doped powder); however, the center and lower parts are maintained at a temperature where the seed crystal is not melted. When the powder raw material (crystal base material powder+dopant doped powder) continues to be supplied with this state being maintained and the melting progresses, the height of the resulting melt gradually increases and once it exceeds 10 mm, the infrared ray irradiated from the above gradually becomes unable to reach the lower part.

That is, although the infrared ray is absorbed by the melt of the powder raw material and converted into heat and the powder raw material is thereby melted, the amount of the infrared ray that reaches the lower part of the melt gradually decreases due to the absorption of the infrared ray, so that the amount of the infrared ray converted into heat also decreases, and an increase in temperature is consequently suppressed.

The seed crystal starts to solidify as the temperature decreases and continues to solidify as a single crystal with the orientation thereof being maintained. In this process, if a slope inclined toward the center is arranged on the bottom of the quartz crucible, the growth of the single crystal from the seed crystal in the center is allowed to continue preferably.

In this case, the inner wall of the quartz crucible is coated with a release agent for inhibiting fusion of molten silicon and quartz, and it is thus necessary to inhibit the growth of a microcrystal from a release agent part that is coated with the release agent. Accordingly, by separately irradiating an infrared ray to the vicinity of the periphery of the melt being formed there so as to maintain the temperature of this part to be higher than the average temperature of other parts of the melt and to thereby inhibit the generation and growth of a microcrystal from the release agent part, the majority of the resulting product excluding its periphery can be obtained as a single-crystal product.

This method has the same basic principles as so-called "Bridgman method", which produces a large single crystal using a seed crystal, or a large single-crystal production method called "Stockbarger method" which was developed by improving the Bridgman method. In the Bridgman method, however, since a powder raw material (crystal base material+dopant) is entirely melted first and then a single crystal formation is allowed to proceed in the upward direction from the bottom, the dopant concentration varies in the vertical direction due to segregation as described above.

In the single-crystal production method of the present invention, the inside of the quartz crucible is heated in advance to about 1,300° C. using an auxiliary heating apparatus, which is arranged on the outer surface of the bottom and vertical wall section of the quartz crucible, and further heated to about 1,450° C. by irradiating thereto an infrared ray so as to melt the powder raw material(crystal base material powder+dopant doped powder), and the height (thickness) of the resulting melt is maintained at 10 to 15 mm.

The thickness of the melt being formed can be determined by lowering a quartz rod from a joystick arranged on the top cover of the closed chamber and actually measuring the position of a solidified product under the melt. The supply, melting and solidification of the powder raw material (crystal base material powder+dopant doped powder) are continuously carried out in this manner and, once the supply of the prescribed powder raw material (crystal base material powder+dopant doped powder) is completed, the dose of the infrared ray is gradually reduced. Then, after the melt is completely solidified, the entire chamber is cooled to room temperature, and a product is taken out.

As a result, a single crystal having a uniform dopant concentration in both the vertical and horizontal directions can be produced.

Further, the single-crystal production method of the present invention is characterized in that the powder raw material is composed of a crystal base material powder and a dopant doped powder.

By using a crystal base material powder and a dopant doped powder in this manner, a desired composition ratio can be easily achieved. For example, when growing a phosphorus-doped N-type silicon single crystal, the powder raw material to be supplied first is adjusted to have a phosphorus concentration that is three times higher than that of an optimum-concentration composition, and this powder raw material is supplied in the same amount as that of a melt phase formed in a steady state, after which the powder raw material having the optimum-concentration composition is supplied in an amount controlled to be the same as that of the material being solidified, whereby the resulting single crystal is allowed to have a composition that roughly conforms to the optimum-concentration composition from the beginning, so that the good-quality product yield as a whole can be improved.

Still further, the single-crystal production method of the present invention is characterized in that the crystal base material powder is a silicon powder.

When the crystal base material powder is a silicon powder in this manner, for example, a silicon single crystal used in a semiconductor-related product can be produced.

Yet still further, the single-crystal production method of the present invention is characterized in that the dopant doped powder is phosphorus or boron.

When the dopant is phosphorus or boron in this manner, an N-type semiconductor silicon or a P-type semiconductor silicon can be produced. For supplying this dopant doped powder, a method of preparing in advance a crystal that contains the dopant at a high concentration and then supplying a dopant doped powder, which is obtained by pulverizing the crystal to the same extent as a silicon powder, separately from the silicon powder, or a method of preparing a mixed powder by mixing a silicon powder and a dopant doped powder and the supplying the this mixed powder can be employed.

Dopant other than phosphorus and boron, such as antimony, arsenic and gallium, also form a melt corresponding to each distribution coefficient in the same manner and, by controlling the amount of a single crystal to be solidified and that of the supplied powder raw material to be the same, a single crystal having a uniform composition can be formed.

While continuously supplying and solidifying the powder raw material, a new microcrystal may be generated from the vertical wall section of the quartz crucible. When such a microcrystal continues to grow and gets into the single crystal being formed in the center, the yield of the single crystal as a whole is deteriorated. Therefore, by maintaining the temperature in the vicinity of the vertical wall section of the quartz crucible around the single crystal in the center to be at least a few degrees higher than the temperature of the center, even when such a microcrystal is generated, the effects thereof can be limited to the vertical wall section of the quartz crucible. In this process, it is preferred to keep rotating the quartz crucible.

Yet still further, the single-crystal production method of the present invention is characterized in that, when the dopant doped powder is phosphorus, first, the powder raw material which has a composition containing phosphorus at a three-fold concentration of an optimum dopant composition is supplied into the quartz crucible in an amount corresponding to an amount of a melt phase in a steady state, and subsequently, the powder raw material whose amount is adjusted to attain a prescribed optimum-concentration composition is continuously supplied into the quartz crucible in accordance with an amount of the raw material being solidified.

Particularly, in the early stage of growing a single crystal using phosphorus as the dopant doped powder, since the melt composition is required to have about three-fold dopant concentration of the optimum dopant concentration, the concentration of the powder raw material (crystal base material powder+phosphorus (dopant doped powder)) to be initially supplied is adjusted with this composition, and the powder raw material is supplied in a melt amount corresponding to the thickness of the melt phase in a steady state. Subsequently, as long as the powder raw material (crystal base material powder+phosphorus (dopant doped powder)) having an optimum-concentration composition can be continuously supplied in the same amount as that of a crystal being solidified, the composition of the resulting crystal conforms to the optimum-concentration composition, so that a highest-quality single crystal can be obtained with high yield.

Furthermore, in the final stage of the crystal production after the completion of supplying the powder raw material (crystal base material powder+phosphorus (dopant doped powder)), the dopant concentration of the parts where remaining melt is solidified gradually increases and is not uniform; however, by keeping the thickness of such parts small, deterioration of the yield as a whole can be inhibited.

Advantageous Effects of the Invention

According to the single-crystal production equipment and single-crystal production method of the present invention, a powder raw material (crystal base material powder+dopant doped powder) is continuously supplied into a quartz crucible in the same amount as that of crystallized material in accordance with the growth of a single crystal, and this enables to make the dopant concentration uniform in both the vertical and horizontal directions with an optimum-concentration composition.

In addition, since the powder raw material (crystal base material powder+dopant doped powder) can be completely melted by irradiating thereto an infrared ray from the upper side of the melt surface, generation of negative crystals can be inhibited. At the same time, since the resulting melt phase is thin, generation of silicon monoxide, which is produced by reaction between the melt and quartz, is largely reduced, so that a large high-quality single crystal containing only a small amount of such impurities can be produced.

DETAILED DESCRIPTION AND BEST MODE FOR CARRYING OUT THE INVENTION

Embodiments (Examples) of the present invention will now be described in more detail based on the drawings.

The single-crystal production equipment and single-crystal production method according to the present invention are used for highly efficiently producing a large single crystal of, for example, 800 to 1,000 mm or larger in diameter, while homogenizing its composition to be optimum.

The term "seed crystal" used herein refers to an initial form of a crystal in the production of a large-diameter single crystal using a single-crystal production equipment, and a single crystal is used. A crystal which is grown from this seed crystal and maintains the same orientation in its entirety is referred to as "single crystal". In contrast, an aggregate of single crystals each having a different orientation is referred to as "polycrystal".

In the case of a polycrystal, individual single crystals have different crystal orientations at their boundaries, and this leads to disadvantages such as reduction in the power generation efficiency. Therefore, a high-performance silicon substrate is desired to be a single crystal which entirely has the same orientation and thus does not contain such crystal grain boundaries.

<Single Crystal Production Equipment 2>

Figure 1:
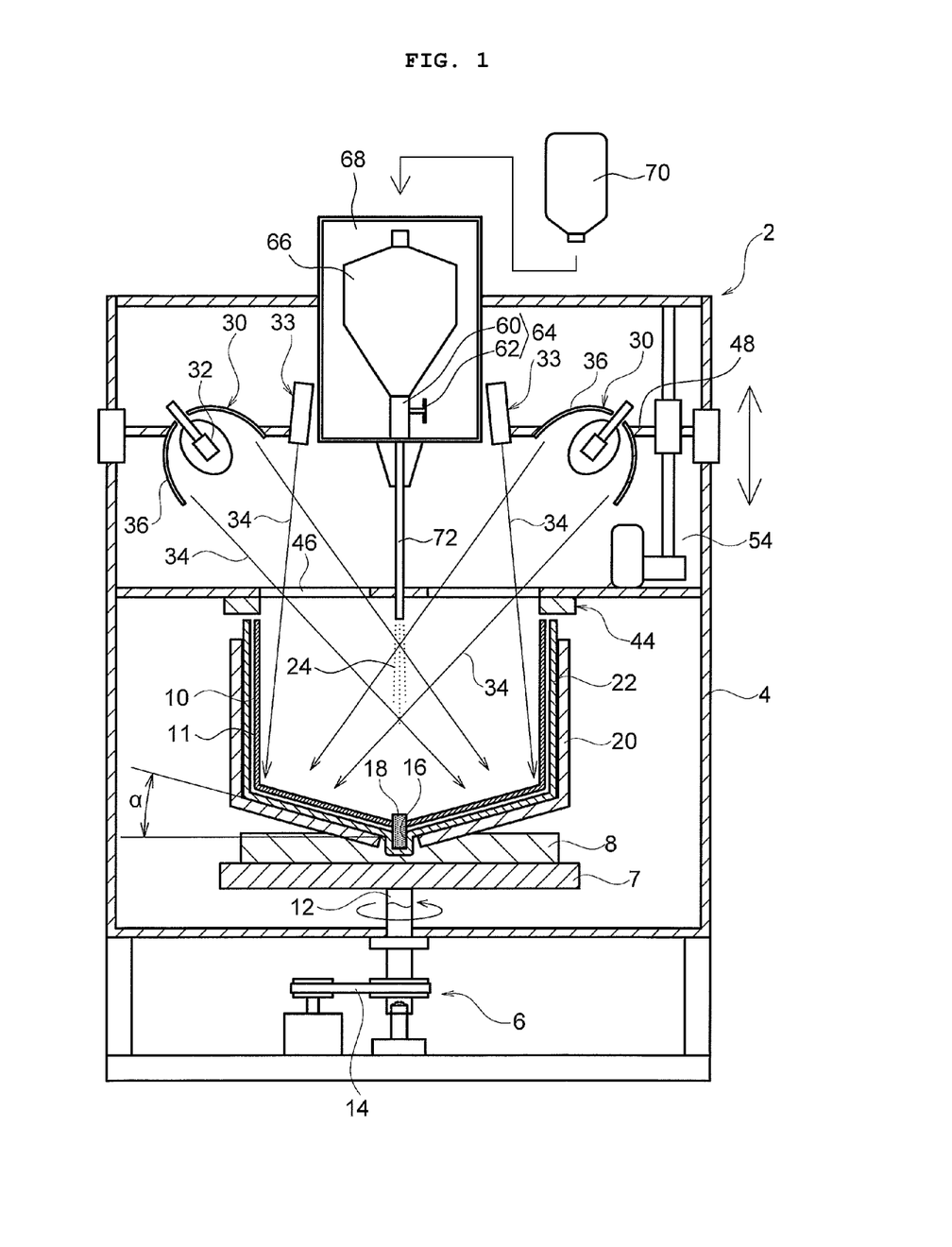
FIG. 1 is a schematic cross-sectional view showing a single-crystal production equipment according to one Example of the present invention.

As shown in FIG. 1, in a single-crystal production equipment 2 of the present Example, a lower table 7 and a pedestal 8, which constitute a driving unit 6, are arranged on the bottom of a closed chamber 4 whose inside can be vacuum-evacuated and which can retain an inert gas atmosphere such as argon gas. On the pedestal 8, a quartz crucible 10 having a substantially cylindrical cross-section is set via a carbon crucible 22 which also has a substantially cylindrical cross-section. The closed chamber 4 is a water-cooling structure which is capable of efficiently adjusting its internal temperature.

Meanwhile, above the closed chamber 4, an infrared ray irradiation apparatus 30 is arranged via a mirror stage 48 at a position away from the axis of a rotating shaft 12 of the driving unit 6, and the mirror stage 48 is configured such that it can be moved in the vertical direction by a mirror stage-operating apparatus 54.

This infrared ray irradiation apparatus 30 is configured such that an infrared ray 34 emitted from an infrared lamp 32 is reflected by the inner surface of an elliptical reflector 36 and the reflected light heats the inside of the quartz crucible 10.

As the infrared lamp 32, a halogen lamp, a xenon lamp or the like can be used. The number of the infrared ray irradiation apparatuses 30 is not restricted to one, and a plurality of the infrared ray irradiation apparatuses 30 may be arranged.

Alternatively to the case where the infrared ray irradiation apparatus 30 is constituted by the infrared lamp 32 and the elliptical reflector 36, the infrared ray irradiation apparatus 30 may be a semiconductor laser module (not shown).

Further, separately from the infrared ray irradiation apparatus 30, it is preferred that the vicinity of a vertical wall section 11 of the quartz crucible 10 be irradiated by an infrared ray local irradiation apparatus 33, which can irradiate the infrared ray 34 over an irradiation range of 5 to 10 mm or so. By this infrared ray local irradiation apparatus 33, the vicinity of the periphery of a melt formed in the quartz crucible 10 is irradiated with the infrared ray 34, so that the temperature in the vicinity of the periphery of the melt formed in the quartz crucible 10 can be increased to be higher than the temperature of the melt in the entire quartz crucible 10. The temperature in the vicinity of the periphery of the melt formed in the quartz crucible 10, which is increased by the infrared ray local irradiation apparatus 33, is preferably at least 3° C. higher than that of the whole quartz crucible 10.

Such infrared ray local irradiation apparatus 33 is, in the same manner as the infrared ray irradiation apparatus 30, arranged on the mirror stage 48 and configured such that it can be moved in the vertical direction by moving the mirror stage 48. As the infrared ray local irradiation apparatus 33, a semiconductor laser module (not shown) is preferably used; however, the infrared ray local irradiation apparatus 33 may also be such an infrared lamp as described above.

Above the closed chamber 4, a powder raw material supply apparatus 68 is further arranged, and this powder raw material supply apparatus 68 comprises: a hopper 66, which stores a powder raw material 24; a supply adjustment unit 64, which supplies a prescribed amount of the powder raw material 24 stored in the hopper 66 to a prescribed position in the quartz crucible 10; and a supply pipe 72, which is arranged on the lower end of the supply adjustment unit 64 and through which the powder raw material 24 is supplied into the quartz crucible 10.

The supply adjustment unit 64 comprises: a supply rate adjustment apparatus 62 which adjusts the rate of supplying the powder raw material 24 into the quartz crucible 10; and a supply position adjustment apparatus 60 which adjusts the supply position, and this configuration enables to adjust the supply of the powder raw material 24 in accordance with the growth state of a single crystal.

The hopper 66 in this embodiment is a hopper for mixed powder, which stores a mixed powder obtained by mixing a crystal base material powder (silicon powder) and a dopant doped powder, and this enables to surely maintain the composition ratio of the powder raw material 24 constant.

In this case, however, the dopant concentration of a melt phase initially formed on a seed crystal 18 is required to be higher than that of the powder raw material 24 at a ratio defined by distribution coefficient. Therefore, a solid in an amount corresponding to the required amount of a solvent phase is separately prepared at a high concentration and placed on the seed crystal 18 in advance, and this solid is melted first to form a solvent phase and the powder raw material 24 starts to be supplied thereafter, whereby a single crystal having a uniform composition in its entirety can be produced.

In this embodiment, a hopper for mixed powder is used as the hopper 66; however, the hopper 66 is not restricted thereto and, for example, the hopper 66 may be constituted by both a hopper for crystal base material powder (a hopper for silicon powder) which stores the crystal base material powder (silicon powder) and a hopper for dopant doped powder which stores the dopant doped powder.

By using both a hopper for crystal base material powder (a hopper for silicon powder) and a hopper for dopant doped powder in this manner, a desired composition ratio can be easily achieved in the supply adjustment unit 64.

For example, when growing a phosphorus-doped N-type silicon single crystal, the powder raw material 24 to be supplied first is adjusted to have a phosphorus concentration that is three times higher than that of an optimum-concentration composition, and this powder raw material 24 is supplied in the same amount as that of a melt phase formed in a steady state, after which the powder raw material 24 having the optimum-concentration composition is supplied in an amount controlled to be the same as that of the material being solidified, whereby the resulting single crystal is allowed to have a composition that roughly conforms to the optimum-concentration composition from the beginning, so that the good-quality product yield as a whole can be improved.

As an alternative to the above-described combination of a hopper for crystal base material powder (a hopper for silicon powder) and a hopper for dopant doped powder, a combination of a hopper for crystal base material powder (a hopper for silicon powder) and a hopper for mixed powder, which stores a mixed powder obtained by mixing a crystal base material powder (silicon powder) and a dopant doped powder, may be used as well.

The upper end of such hopper 66 is configured such that a powder raw material container 70, which stores the powder raw material 24, can be attached to and detached from as desired. (FIG. 1 shows a state where the powder raw material container 70 is detached).

By using such powder raw material container 70, the powder raw material 24 can be freshly supplied even in the midst of operating the single-crystal production equipment 2 to produce a single crystal, and this enables to continuously supply a required amount of the powder raw material 24 into the quartz crucible 10 at all times without having to hold an extremely large powder raw material container 70 over the hopper 66, so that an increase in the size of the single crystal production equipment 2 can be avoided.

The powder raw material container 70 is preferably configured in conformity with the specifications of the hopper 66. For example, as in this embodiment, when the hopper 66 is a hopper for mixed powder which stores a mixed powder obtained by mixing a silicon powder and a dopant doped powder, it is preferred that the powder raw material container 70 be configured to store the mixed powder.

Meanwhile, when the hopper 66 is constituted by a combination of a hopper for crystal base material powder (a hopper for silicon powder) and a hopper for dopant doped powder, the powder raw material container 70 may be a combination of a container for crystal base material powder (container for silicon powder) and a container for dopant doped powder.

The supply pipe 72 of the powder raw material 24 is configured such that a prescribed amount of the powder raw material 24 is supplied therethrough to a prescribed position on the seed crystal 18 contained in the quartz crucible 10 by the supply adjustment unit 64 arranged above the supply pipe 72.

Figure 2:
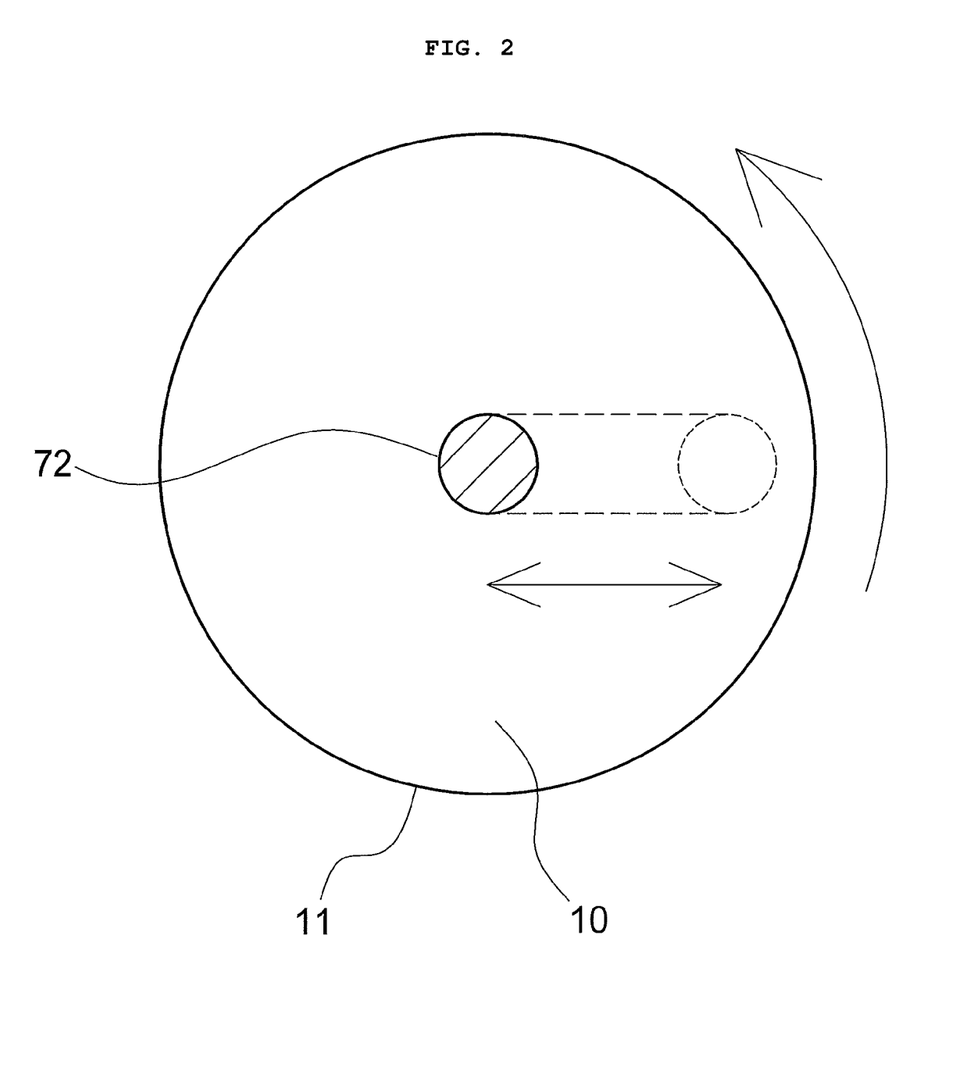
FIG. 2 is a drawing of the single-crystal production equipment shown in FIG. 1 as viewed from the above and is used for explaining the movement of a supply pipe of a powder raw material.

As shown in FIG. 2, the supply pipe 72 is arranged above the seed crystal 18 placed in the quartz crucible 10 and configured such that it can be moved between a central position above the seed crystal 18 and a position of the vertical wall section 11.

As for the position and amount at which the powder raw material 24 is supplied through the supply pipe 72, they are desirably determined using the supply position adjustment apparatus 60 and the supply rate adjustment apparatus 62 of the supply adjustment unit 64, respectively.

For example, by reducing the supply amount of the powder raw material 24 in the vicinity of the center of the quartz crucible 10 and increasing the supply amount toward the vertical wall section 11 of the quartz crucible 10, the powder raw material 24 is evenly supplied at all positions in the quartz crucible 10 and can thus be surely melted, and a single crystal having a uniform composition in both the vertical and horizontal directions at an optimum additive concentration can be produced.

The material of such supply pipe 72 is preferably quartz. Since quartz does not absorb the infrared ray 34, it does not cause a temperature increase by absorbing stray light from the infrared source and, since quartz has a smooth surface, the amount of the powder raw material 24 retained thereon can be reduced, which are preferred.

The driving unit 6 transmits a rotational force via a belt 14 to the rotating shaft 12 which supports the lower table 7 arranged in the closed chamber 4, and the quartz crucible 10 placed on the pedestal 8 rotates at a prescribed speed by receiving the force from the belt 14.

Therefore, at the time of melting, the powder raw material 24 supplied to the quartz crucible 10 can be heated evenly.

On the bottom of the quartz crucible 10, a slope (inclination angle=α) which is inclined toward the center at an angle of 3 to 60 degrees, preferably 5 to 30 degrees, is formed. The smaller this slope (inclination angle=α), the more likely it is that other crystal starts to grow in the middle. Meanwhile, when the inclination angle α is excessively large, the product obtained between the center and the vertical wall section 11 of the quartz crucible 10 has a non-standard size, so that the product yield is deteriorated.

In the vicinity of the center on the bottom of the quartz crucible 10, a cylindrical recess 16 is arranged. This recess 16 has, for example, an inner diameter of 5 cm and a height of 10 cm. By forming such a recess 16, for example, the silicon seed crystal 18 can be placed in an upright position and, by reducing the gap between the recess 16 and the seed crystal 18 as much as possible, generation of a new coarse microcrystal from a site other than the seed crystal 18 can be inhibited.

Alternatively to directly arranging the recess 16 on the quartz crucible 10 as shown in FIG. 1, the recess 16 may also be formed by, for example, making a hole in the center on the bottom of the quartz crucible 10 and then fitting a separately-produced quartz concave member having a truncated conical shape into the hole, although this is not shown in the drawing.

In this case, particularly by tapering the margin of the hole and also tapering the periphery of the concave member in substantially the same manner, a gap created between these members can be eliminated as much as possible. As a result, leakage of the melt from this junction can be inhibited.

On the outer surface of the bottom and vertical wall section 11 of the quartz crucible 10, a carbon heater 20 is arranged as an auxiliary heating apparatus. This carbon heater 20 is preferably arranged away from the wall surface of the recess 16 such that the silicon seed crystal 18 inside the quartz crucible 10 is not directly heated.

Meanwhile, between the quartz crucible 10 and the infrared ray irradiation apparatus 30, an infrared ray transmission window 46 is arranged. The infrared ray transmission window 46 may be arranged on the path of the infrared rays 34 emitted from the infrared ray irradiation apparatus 30 and the infrared ray local irradiation apparatus 33. The material of the infrared ray transmission window 46 is not particularly restricted as long as it can transmit the infrared rays 34; however, the infrared ray transmission window 46 is preferably made of, for example, quartz.

It is preferred that the quartz crucible 10 be movable in the vertical direction at a prescribed speed in accordance with the growth rate of a single crystal such that the infrared rays 34 from the infrared ray irradiation apparatus 30 and the infrared ray local irradiation apparatus 33 be constantly irradiated into the quartz crucible 10 through the infrared ray transmission window 46.

In the same manner, it is also preferred that the closed chamber 4 be configured to be movable in the vertical direction along with the infrared ray irradiation apparatus 30 arranged outside the closed chamber 4.

In this case, the driving unit 6 may be imparted with a function of vertically moving the quartz crucible 10 and a function of vertically moving the closed chamber 4.

Since evaporants in the quartz crucible 10 are likely to adhere to the inner surface of the infrared ray transmission window 46, it is preferred that an evaporant adhesion-inhibiting apparatus 44 be arranged on the crucible-side outer periphery of the infrared ray transmission window 46.

As the evaporant adhesion-inhibiting apparatus 44, a gas-blowing apparatus, which is configured to blow argon gas or the like against the infrared ray transmission window 46, is arranged on the periphery of the infrared ray transmission window 46.

The single-crystal production equipment 2 according to one Example of the present invention is configured as described above, and a single-crystal production method using the single-crystal production equipment 2 will now be described. It is noted here that, in FIG. 3, the powder raw material 24 is depicted to have an elliptical shape for the sake of convenience in making the drawings; however, the diameter, shape and size of the particles are not restricted.

<Single Crystal Production Method>

Figure 3A:
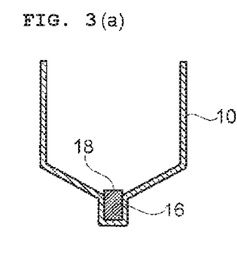
FIGS. 3(a)-(g) are a process chart showing the steps of producing a single crystal using the single-crystal production equipment of the present invention in one Example of the present invention.

First, as shown in FIG. 3(a), the silicon seed crystal 18 is placed in the recess 16 arranged in the vicinity of the center on the bottom of the quartz crucible 10.

Then, the closed chamber 4 is hermetically sealed, and the atmosphere inside the closed chamber 4 is vacuum-evacuated by an exhaust apparatus (not shown). Further, from the gas-blowing apparatus which also has the function of the evaporant adhesion-inhibiting apparatus 44, an inert atmosphere such as argon gas is introduced into the closed chamber 4.

Meanwhile, operation of the carbon heater 20 arranged the outer surface of the bottom and vertical wall section 11 of the quartz crucible 10 is initiated, as a result of which the lower side of the quartz crucible 10 is heated to about 1,300° C. In this process, since the carbon heater 20 is arranged away from the recess 16 of the quartz crucible 10, the seed crystal 18 is not subjected to a large amount of heat.

It is preferred that the inner surface of the quartz crucible 10 be coated with a release agent composed of silicon nitride. This enables to easily remove a silicon single crystal, which is to be eventually produced, from the quartz crucible 10.

Figure 3B:
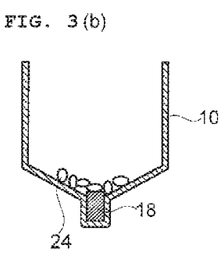

Next, from the powder raw material supply apparatus 68, a mixed powder (powder raw material 24) in which a silicon powder and a dopant doped powder are mixed at a prescribed composition ratio in advance is supplied into the quartz crucible 10.

Consequently, as shown in FIG. 3(b), the powder raw material 24 is accumulated on the bottom of the quartz crucible 10.

Further, the powder raw material 24 is melted by irradiating the infrared ray 34 into the quartz crucible 10 from the infrared lamp 32 of the infrared ray irradiation apparatus 30 positioned above the quartz crucible 10. It is noted here that this melting process is carried out while rotating the quartz crucible 10.

The powder raw material 24 continues to be supplied from the powder raw material supply apparatus 68 for a while after the start of the melting.

Figure 3C:
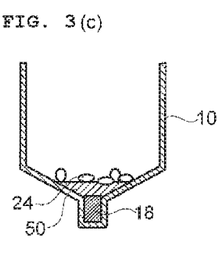

When the powder raw material 24 is melted and liquefied in the upper side of the quartz crucible 10 by irradiation with the infrared ray 34 emitted from the infrared ray irradiation apparatus 30 and unmelted powder raw material 24 is supplied thereto, this powder raw material 24 floats on a liquefied raw material melt 50. Then, by further melting the powder raw material 24 floating on the liquefied raw material melt 50, the surface of the melt is slowly raised, whereby the melted raw material melt 50 is gradually accumulated in the quartz crucible 10 as shown in FIG. 3(c).

Figure 3D:
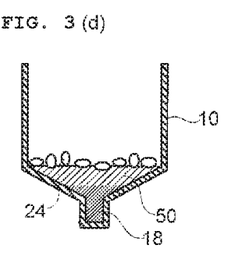

Once the thickness of the raw material melt 50 reaches, for example, 10 mm, since the infrared ray 34 no longer reaches therebelow, the temperature of the raw material melt 50 decreases, as a result of which, as shown in FIG. 3(d), solidification starts from the upper side of the seed crystal 18 placed on the center of the quartz crucible 10.

Figure 3E:
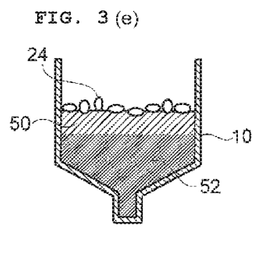

In this state, as shown in FIG. 3(e), the powder raw material 24 composed of a silicon powder raw material and a dopant doped powder continues to be supplied, melted and solidified in the lower part and, once it reaches the vertical wall section 11 of the quartz crucible 10, solidification continues in the upward direction. At this point, the infrared ray local irradiation apparatus 33 is put into operation so as to maintain the temperature of the vertical wall section 11 of the quartz crucible 10 at a few degrees higher than the surrounding.

Figure 3F:
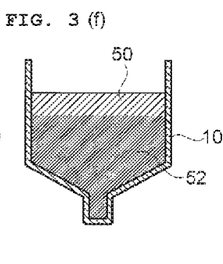

Once the supply of a prescribed amount of the powder raw material 24 is completed and the powder raw material 24 is completely melted as shown in FIG. 3(f), the lamp power of the infrared ray irradiation apparatus 30 and that of the infrared ray local irradiation apparatus 33 are slowly lowered.

Thereafter, as shown in FIG. 3 (g), the whole melt is made into a solidified product 52 (single crystal).

Figure 3G:
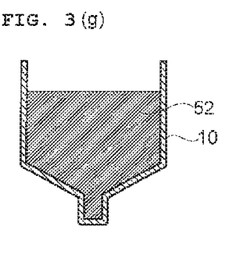

Once the solidification of the whole melt is completed, the temperature is slowly lowered and the closed chamber 4 is cooled to room temperature and opened, after which the solidified product 52 (single crystal) in the quartz crucible 10 is taken out.

In this Example, the irradiation dose distribution of the infrared ray 34 is designed such that the surface of the solidified product 52 can be maintained as flat as possible throughout the production process. At the same time, it is preferred to delay the crystallization from the surface of the quartz crucible 10 by irradiating the part of the melt that is in contact with the quartz crucible 10 (the vicinity of the wall section 11) using the infrared ray local irradiation apparatus 33 at an irradiation does of about 2 to 7% higher, preferably about 2 to 5% higher, than that of the infrared ray irradiation apparatus 30 which heats the whole quartz crucible 10 and thereby increasing the temperature in the vicinity of the vertical wall section 11 of the quartz crucible 10 to be not less than 3° C. higher, preferably not less than 5° C. higher, than the temperature of the whole quartz crucible 10.

By this, even if new microcrystals start to grow from this part, since the growth of a large single crystal proceeds on the inner side, the growth of the large single crystal on the inner side can be prevented from being adversely affected by the microcrystals formed afterwards.

As described above, in the single-crystal production equipment 2 and single-crystal production method according to the present invention, the supply of the powder raw material 24 composed of a silicon powder raw material and a dopant doped powder into the quartz crucible 10 and the melting and solidification of the powder raw material 24 are continuously carried out. That is, since a single crystal is produced while continuously supplying the powder raw material 24 to the quartz crucible 10 in the same amount as that of the material being solidified, the composition of the resulting crystal can be made uniform.

This enables to produce a high-quality single crystal having a uniform composition at a dopant concentration that allows the single crystal to realize the highest conversion efficiency when used for photovoltaic power generation. A single crystal having an optimum composition can thus be produced with good yield, and this consequently contributes to a reduction of the production cost.

The single-crystal production equipment 2 of the present invention and a single-crystal production method using the single-crystal production equipment 2 have been described thus far; however, the present invention is not restricted to the above-described embodiments.

For instance, in the above-described Example, the carbon heater 20 is arranged on the lower surface of the quartz crucible 10 as an auxiliary heating apparatus; however, the auxiliary heating apparatus is not restricted to the carbon heater 20 by any means. An auxiliary heating apparatus other than the carbon heater 20 can also be used to heat a portion of the outer surface of the quartz crucible 10.

Further, although the quartz crucible 10 is described above to have a substantially cylindrical shape, this is also not restricted, and the quartz crucible 10 may have a substantially tetragonal columnar shape. A variety of modifications can be made within the scope of the objects of the present invention.

Moreover, in the above-described Example, the powder raw material 24 is prepared by incorporating phosphorus as a dopant doped powder into a silicon powder raw material for the production of an N-type semiconductor, or by incorporating boron as a dopant doped powder into a silicon powder raw material for the production of a P-type semiconductor. When a silicon powder raw material and a dopant doped powder of phosphorus, boron or the like are separately supplied, there is an advantage that the dopant concentration can be changed as appropriate. However, in most cases, since the optimum concentration is known, it is efficient to prepare a powder raw material (silicon powder raw material+dopant doped powder) 24 that has a composition ratio conforming to the optimum concentration and to supply this powder raw material 24 at once.

It is efficient to supply the powder raw material 24, in which a silicon powder raw material and a dopant doped powder are mixed in advance, at once in this manner, and the productivity is thereby improved.

Further, in the above-described Example, no particular mention is made on the particle size of the powder raw material 24 and the like; however, when the particle size is excessively large, it takes time to melt the particles, and the particles, upon falling into the quartz crucible 10, may sink through the melt phase and reach the surface of the solidified product 52 below. If the powder raw material 24 and the like reach the surface of the solidified product 52, they are incorporated into the solidified product 52, and the growth of other crystals tends to start therefrom.

Meanwhile, if the powder raw material 24 and the like have an excessively small particle size, since the powder raw material 24 and the like are scattered in the surrounding when they are allowed to fall toward the quartz crucible 10, the controllability is impaired. Accordingly, the particles of the pre-mixed powder raw material 24 preferably have a size of 0.1 to 0.5 mm or so in diameter.

Moreover, when supplying the powder raw material 24 into the quartz crucible 10, it is necessary to supply the powder raw material 24 evenly from the center to the outer periphery of a circle with respect to the circular plane of the quartz crucible 10, although this is not explained in detail in the above-described Example.

Accordingly, as shown in FIG. 2, for example, while rotating the circular quartz crucible 10, by controlling the moving speed of the supply pipe 72 of the powder raw material supply apparatus 68 such that the supply pipe 72 moves faster in the vicinity of the center of the quartz crucible 10 and slows down as it approaches the vertical wall section 11, the powder raw material (crystal base material powder+dopant doped powder) 24 can be evenly supplied to the entire surface of the quartz crucible 10.

Furthermore, in the above-described embodiment, a case where a silicon powder is used as the crystal base material powder was described as an example, the crystal base material powder is not restricted thereto, and any powder prepared in accordance with the substance to be produced can be used.

In the above-described manner, a variety of modifications can be made in the single-crystal production equipment 2 of the present invention within the scope of the objects of the present invention.

DESCRIPTION OF SYMBOLS

2: single-crystal production equipment
4: closed chamber
6: driving unit
7: lower table
8: pedestal
10: quartz crucible
11: vertical wall section
12: rotating shaft
14: belt
16: recess
18: seed crystal
20: carbon heater
22: carbon crucible
24: powder raw material
30: infrared ray irradiation apparatus
32: infrared lamp
33: infrared ray local irradiation apparatus
34: infrared ray
36: elliptical reflector
44: evaporant adhesion-inhibiting apparatus
46: infrared ray transmission window
48: mirror stage
50: raw material melt
52: solidified product
54: mirror stage-operating apparatus
60: supply position adjustment apparatus
62: supply rate adjustment apparatus
64: supply adjustment unit
66: hopper
68: powder raw material supply apparatus
70: powder raw material container
72: supply pipe
α: inclination angle

The invention claimed is:

1. A single-crystal production equipment comprising, at least:
a quartz crucible in which a seed crystal is placed on its bottom;
a powder raw material supply apparatus which supplies a powder raw material into said quartz crucible;
an infrared ray irradiation apparatus positioned to irradiate said powder raw material supplied into said quartz crucible from said powder raw material supply apparatus with an infrared ray; and
an infrared ray local irradiation apparatus which is separate from said infrared ray irradiation apparatus,
said single-crystal production equipment being configured to produce a single crystal in said quartz crucible by applying said infrared ray into said quartz crucible from said infrared ray irradiation apparatus and thereby melting and solidifying said powder raw material,
wherein said single-crystal production equipment is configured such that:
said supplied powder raw material is irradiated with said infrared ray by said infrared ray irradiation apparatus while being supplied into said quartz crucible from said powder raw material supply apparatus,
said powder raw material supply apparatus continuously supplies said powder raw material into said quartz crucible in accordance with an amount of melted powder raw material being solidified, and
said infrared ray local irradiation apparatus is positioned to apply an infrared ray only to a periphery of a melt formed in said quartz crucible and thereby increases a temperature in a vicinity of the periphery of said melt formed in said quartz crucible to be higher than a temperature of an entirety of said melt in said quartz crucible.

2. The single-crystal production equipment according to claim 1, wherein an auxiliary heating apparatus is arranged on an outer surface of the bottom and of a vertical wall section of said quartz crucible.

3. The single-crystal production equipment according to claim 1, wherein said powder raw material supply apparatus comprises:
a hopper which stores said powder raw material;
a supply adjustment unit which supplies a prescribed amount of said powder raw material stored in said hopper to a prescribed position in said quartz crucible; and
a supply pipe which is arranged on a lower end of said supply adjustment unit and through which said powder raw material is supplied into said quartz crucible.

4. The single-crystal production equipment according to claim 3, wherein said supply adjustment unit comprises a supply rate adjustment apparatus which adjusts a rate at which said powder raw material is supplied into said quartz crucible.

5. The single-crystal production equipment according to claim 3, wherein said supply adjustment unit comprises a supply position adjustment apparatus which moves said supply pipe laterally from a central position above said quartz crucible to a position above an outer periphery of the quartz crucible.

6. The single-crystal production equipment according to claim 3, wherein said hopper is configured such that a powder raw material container, which stores said powder raw material, is detachably attached thereto.

7. The single-crystal production equipment according to claim 3, wherein said hopper is constituted by:
a hopper for crystal base material powder, which stores a crystal base material powder; and
a hopper for dopant doped powder, which stores a dopant doped powder.

8. The single-crystal production equipment according to claim 3, wherein said hopper is a hopper for mixed powder, which stores a mixed powder obtained by mixing a crystal base material powder and a dopant doped powder.

9. The single-crystal production equipment according to claim 3, wherein said hopper comprises:

a hopper for crystal base material powder, which stores a crystal base material powder; and a hopper for mixed powder, which stores a mixed powder obtained by mixing said crystal base material powder and a dopant doped powder.

10. The single-crystal production equipment according to claim 7, wherein said crystal base material powder is a silicon powder.

11. The single-crystal production equipment according to claim 1, wherein a recess is formed in a vicinity of a center on the bottom of said quartz crucible, and said seed crystal is placed in said recess.

12. The single-crystal production equipment according to claim 1, wherein a slope inclined toward the center is formed on the bottom of said quartz crucible, and said slope is inclined at an angle in a range of 3 to 60 degrees.

13. The single-crystal production equipment according to claim 1, wherein said quartz crucible is housed inside a carbon crucible.

14. The single-crystal production equipment according to claim 1, wherein said infrared ray irradiation apparatus comprises:

an elliptical reflector whose inner surface is used as a reflection surface; and an infrared lamp which is arranged at a first focus position on the bottom side of said elliptical reflector.

15. The single-crystal production equipment according to claim 14, wherein said infrared lamp is a halogen lamp or a xenon lamp.

16. The single-crystal production equipment according to claim 1, wherein said infrared ray irradiation apparatus is a semiconductor laser module which applies a laser beam of said infrared ray.

17. The single-crystal production equipment according to claim 1, wherein a plurality of said infrared ray irradiation apparatus is arranged.

18. The single-crystal production equipment according to claim 1, wherein an infrared ray transmission window, which transmits said infrared ray applied from said infrared ray irradiation apparatus and/or said infrared ray local irradiation apparatus, is arranged between said infrared ray irradiation apparatus and said quartz crucible.

19. The single-crystal production equipment according to claim 18, wherein an evaporant adhesion-inhibiting apparatus is arranged on a crucible-side outer periphery of said infrared ray transmission window.

20. The single-crystal production equipment according to claim 1, wherein said quartz crucible is configured to be rotatable.

21. The single-crystal production equipment according to claim 1, wherein said quartz crucible is configured to be movable in a vertical direction at a prescribed speed.

22. The single-crystal production equipment according to claim 2, wherein said quartz crucible and said auxiliary heating apparatus are housed in a vacuum-evacuable closed chamber.

23. The single-crystal production equipment according to claim 22, wherein said closed chamber is a water-cooling structure.

24. The single-crystal production equipment according to claim 22, wherein said closed chamber is configured to be movable in a vertical direction together with said infrared ray irradiation apparatus arranged outside said closed chamber.

25. The single-crystal production equipment according to claim 1, wherein said dopant doped powder is phosphorus or boron.

26. The single-crystal production equipment according to claim 1, wherein an inner wall of the quartz crucible has a release agent part that coats the inner wall with a releasing agent.

* * * * *